US007347701B2

(12) United States Patent
Daly et al.

(10) Patent No.: US 7,347,701 B2
(45) Date of Patent: Mar. 25, 2008

(54) DIFFERENTIAL I/O SPLINE FOR INEXPENSIVE BREAKOUT AND EXCELLENT SIGNAL QUALITY

(75) Inventors: Gregory M. Daly, Seattle, WA (US); Dan Willis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/436,860

(22) Filed: May 17, 2006

(65) Prior Publication Data

US 2007/0269998 A1 Nov. 22, 2007

(51) Int. Cl.
*H01R 12/00* (2006.01)
*H05K 1/00* (2006.01)

(52) U.S. Cl. .......................................... 439/70; 439/68

(58) Field of Classification Search ................. 439/70, 439/941, 71, 608, 68

See application file for complete search history.

(56) References Cited

U.S. PATENT DOCUMENTS

| | | | | |
|---|---|---|---|---|
| 3,516,156 | A * | 6/1970 | Steranko | 29/830 |
| 5,479,319 | A * | 12/1995 | Werther | 361/784 |
| 6,102,711 | A * | 8/2000 | Hanada et al. | 439/70 |
| 6,556,455 | B2 * | 4/2003 | Dibene et al. | 361/785 |
| 6,585,527 | B2 | 7/2003 | Koopman et al. | |
| 6,609,933 | B2 * | 8/2003 | Yamasaki | 439/608 |
| 6,652,318 | B1 * | 11/2003 | Winings et al. | 439/608 |
| 6,692,272 | B2 * | 2/2004 | Lemke et al. | 439/108 |
| 6,699,046 | B2 * | 3/2004 | Ho et al. | 439/70 |
| 6,767,252 | B2 | 7/2004 | McGrath et al. | |
| 6,811,410 | B2 * | 11/2004 | Figueroa et al. | 439/68 |
| 7,056,766 | B2 * | 6/2006 | Shiu et al. | 438/106 |

* cited by examiner

*Primary Examiner*—Hae Moon Hyeon
(74) *Attorney, Agent, or Firm*—David P. McAbee

(57) ABSTRACT

A apparatus is described herein for configuring Input/Output (I/O) conductors on an integrated circuit (IC) or in a socket. At least a portion of the I/O conductors for an IC and/or contacts/receptacles of a socket are configured in a repeatable 2×4 rectangular T pattern. The rectangular T pattern includes a first line of four conductors, which include two ground conductors and a first differential pair of conductors, and a second line of four conductors, which include a second and a third pair of differential conductors. The I/O conductors on the IC may be pads/lands in an land-grid-array (LGA) style socket, pins in a pin-grid-array (PGA) style socket, or other conductor in another style of socket, while the socket includes corresponding contacts, receptacles, etc.

18 Claims, 4 Drawing Sheets

DIFFERENTIAL I/O SPLINE FOR INEXPENSIVE BREAKOUT AND EXCELLENT SIGNAL QUALITY

FIELD

This invention relates to the field of coupling integrated circuits (ICs) to circuit boards and, in particular, to input/output (I/O) signal and socket configuration.

BACKGROUND

Computer systems have quickly become the center of numerous operations performed in households throughout the world. Previously, a computer was used only for simple computing operations; however, uses for computers have progressed from this simple model into an electronics hub. A few examples of this progression include using a computer as a media center, a TV, a stereo, and a picture repository. As a result, the amount of internal logic, as well as the need for more input/output (I/O) terminals to communicate with external devices, has drastically increased.

Yet, as interconnects, such as a front-side bus (FSB), continue to increase in speed to ensure adequate bandwidth for integrated circuits, such as microprocessors, signal integrity becomes an ever-more present concern. Degradation of signal quality potentially leads to signaling errors through both voltage level and timing failures. Examples of contributing factors to adverse signal integrity includes distance/amount of a ground return paths, distance between signals, number of signals, impedance mismatches, cross-coupling, and other numerous factors.

In the past, as the number of I/O terminals on a microprocessor and the pins on a package for the microprocessor have increased, the number of ground terminals and pins have been increased to ensure signal quality. For example, past packages have included a signal to ground ration of one ground signal for each two signal carrying pins. However, as stated above, as the number of signals increase, continuing to hold the same signal to ground ratio leads to extremely large packages that are prohibitively expensive. Yet, if signal pins are isolated and do not have adequate ground return paths, the signal quality of high speed signals potentially affects performance.

BRIEF DESCRIPTION OF THE DRAWINGS

The present invention is illustrated by way of example and not intended to be limited by the figures of the accompanying drawings.

DETAILED DESCRIPTION

In the following description, numerous specific details are set forth such as examples of sockets, I/O signaling conductors, integrated circuits, packaging techniques, etc. in order to provide a thorough understanding of the present invention. It will be apparent, however, to one skilled in the art that these specific details need not be employed to practice the present invention. In other instances, well known components or methods, such as manufacturing integrated circuits, packaging integrated circuits, forming I/O terminals, pins, or contacts, and specific socket retention mechanisms have not been described in detail in order to avoid unnecessarily obscuring the present invention.

The method and apparatus described herein are for providing a cost-effective I/O terminal and/or socket layout. However, the methods and apparatuses for configuring I/O terminals/sockets are not so limited, as they may be implemented on any integrated circuit requiring a bump, pad, contact, pin, or other I/O conductor pattern.

Socket

Figure 1:
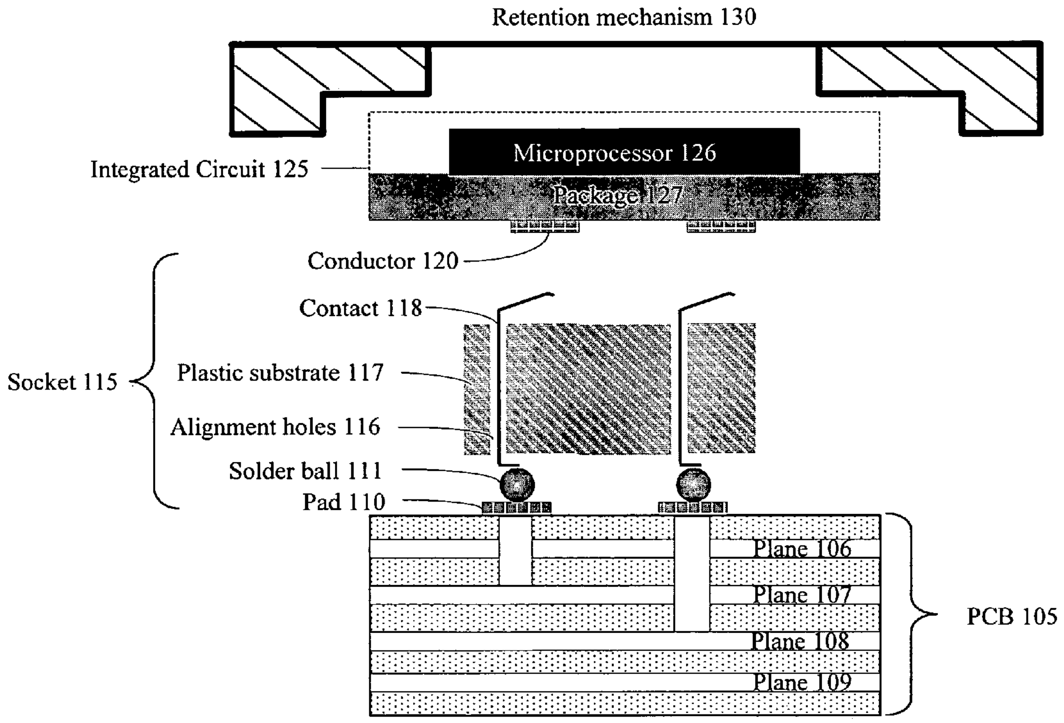
FIG. 1 illustrates an embodiment of a cross-sectional side view of a land grid array socket for coupling an integrated circuit to a printed circuit board (PCB).

Referring to FIG. 1, a cross-sectional side view of a socket is illustrated. As depicted, socket 115 includes pad 110 coupled to printed circuit board (PCB) 105, solder ball 111 coupling contact 118 to pad 110, and alignment holes 116 in plastic substrate 117 to hold contact 118. However, use of the term socket is not so limited. In fact, use of the term socket potentially refers to the mechanism soldered or semi-permanently attached to a circuit board in conjunction with the integrated circuit held in place and electrically coupled to the circuit board by the mechanism soldered or semi-permanently attached to the circuit board. Therefore, a socket includes any mechanism for electrically coupling an integrated circuit to a circuit board.

Reference to the term "socket-side" often refers to the mechanism semi-permanently attached to the circuit board. As an example, socket 115 includes contacts 118 on the socket-side, as socket 115 and contacts 118 are soldered to PCB 105. This is referred to herein as semi-permanently attached to PCB 105, as it is not readily or easily removable from PCB 105. For example, a de-soldering process exists to remove socket 115 from PCB 105 through great effort and expense. Hence, socket 115 is not considered "permanently" coupled to PCB 105. In contrast, the terms IC-side, package-side, or processor-side refer to the terminals or conductors permanently or semi-permanently coupled to integrated circuit. For example, conductor/pad 120 is coupled to IC 125. In the alternative to an LGA socket illustrated, in a PGA socket, conductors 120 include pins coupled to package 127, and therefore, are considered IC-side. Furthermore, in a PGA socket, contact 118 is a receptacle for pins coupled socket-side to PCB 105. The receptacle often resembles more of a barrel to receive a pin coupled to IC 125.

As stated above, in the embodiment shown in FIG. 1, socket 115 is a land-grid array (LGA) socket, as contacts 118 are soldered, i.e. semi-permanently, coupled to PCB 105, and integrated circuit 125, which comprises microprocessor 126 in package 127, including pads/lands, such as conductor 120, to be electrically coupled to contact 118 when inserted in socket 115. An LGA socket is shown and described herein to illustrate an embodiment of the invention. However, it will be readily apparent that any style socket, I/O terminals, or I/O conductors may be used, as the configuration of the socket, I/O terminals, or I/O conductors on the integrated circuit and/or in the socket provides an inexpensive and high reliability solution for many styles of sockets.

For example, socket 115 may be a ball grid array (BGA) socket to couple I/O terminals/pads on integrated circuit 125 to PCB 105 directly through solder balls, a pin grid array (PGA) socket to couple pins from integrated circuit 125 to PCB 105 through pin receptacles disposed on PCB 105, or other socket including I/O conductors to electrically couple integrated circuit 125 to PCB 105. Therefore, I/O conductors as part of an integrated circuit, such as IC 125, may include a pad, such as conductor 120, a pin, a ball, a solder ball, a bump, or other conductor to be electrically coupled to a PCB, such as PCB 105, through a socket.

Also note, that other commonly known packaging and socketing techniques may be used, such as wirebond or flip-chip mounting. LGA, PGA, BGA, and other socket manufacture and materials are not discussed in detail, as they are well-known, and would only serve to obscure the invention.

Printed Circuit Board (PCB) and Retention Mechanism

FIG. 1 depicts socket 115 coupled to PCB 105. Often a socket is permanently or at least semi-permanently coupled to PCB 105 to allow for modularity in a system. For example, if microprocessor 126 was directly soldered to PCB 105, upon a defect, failure, or aspiration to upgrade IC 125, a new PCB, i.e. motherboard, would have to be purchased to swap out microprocessor 126. However, with socket 115, microprocessor 126 may be held in electrical contact with PCB, through a retention mechanism, such as retention mechanism 130, and microprocessor 115 is easily swapped or disconnected by disengaging retention mechanism 130.

Retention mechanism 130 is illustrated as a compression clamp to provide pressure on a top side of integrated circuit 125 down toward PCB 105. However, any retention mechanism may be used to hold IC 125 in socket 115. In an LGA socket, such as the one shown, strong electrical contact is made when contacts, such as contact 118, is compressed by IC 125 and conductor 120. Therefore, often a retention mechanism, such as mechanism 130 includes a top clamping plate, as well as a bottom clamping plate, not shown, on the underside of PCB 105 to aide in the compression of IC 125 and socket 115. Other components that are not shown may also be present, such as an integrated heat sink (IHS) device.

In the past with PGA sockets, a lever was used to clamp the pins into the receptacles of the socket to ensure electrical connection. In another embodiment, other retention mechanisms may be used. For example, tension pins may be used in a PGA or LGA style socket to hold IC 125 in electrical connection with socket 115 and PCB 105. Use of tension pins is described in co-pending application with Ser. No. 10/955,676, entitled, "Hybrid Compression Socket Connector for Integrated Circuits."

PCB 105 includes any circuit board to couple an integrated circuit to. In one embodiment, PCB 105 is a motherboard. As illustrated, motherboard 105 includes multiple layers, such as planes 106-109. Although PCB 105 is illustrated as a 4-layer motherboard, because it includes four planes, PCB 105 may include any number of layers, such as 8 layers. Often layers of PCB 105 and traces of PCB 105 are isolated from each other by dielectric materials, such as FR4. FR4 is commonly used due to its relative inexpensive nature; however, any known dielectric material may be used.

Plane 106-109 include power planes, ground planes, or signal planes. For example, assume that plane 107 is a signal plane including traces coupled to another IC device. Upon inserting IC 125 in socket 115, electrical connection is made from conductor 120, through contact 118, through solder ball 111, through pad 110, and through via 102 to a trace in signal plane 107. Note that the same connection scheme is potentially used for power, ground, and signaling pins. Furthermore, electrical coupling is achieved in other socket configurations, such as PGA or BGA sockets, in a similar manner.

Integrated Circuit

Integrated circuit (IC) 125 may include any IC or other electronic device to be coupled to a circuit board. Examples of IC 125 include a processor, a microprocessor, a microprocessor in a package, a controller, a controller hub, a field programmable gate array (FPGA), programmable logic array (PLA), a microcontroller, advanced programmable interrupt controller (APIC), or other semi-conductor or electronic device.

In one embodiment, integrated circuit 125 is a microprocessor in a package, as illustrated in FIG. 1. A package, such as package 127, is similar to the configuration of a socket or PCB. For example, in one embodiment, package 127 is a multi-layered package coupling pads, such as conductor 120, through vias and traces in package 127 to pads/bumps of microprocessor 126. Microprocessor 126 may be mounted on package 127 in any manner. For example, flip-chip mounting is used to mount microprocessor 126, where solder beads are deposited on pads of microprocessor 126, microprocessor 126 is mounted on package 127, and the solder is reflowed. Flip-chip and wire-bonding are not discussed herein in detail to avoid obscuring the invention; yet, any known method of mounting an IC on a package may be used.

Here, package 127 includes pads, conductors, or lands coupled to terminals/pads of microprocessor 126. In one embodiment, package 127 is a multi-layered package with vias to connect conductors, such as conductor 120, to terminals/pads of microprocessor 127. As stated above, an LGA socket is illustrated in FIG. 1; however, in other socket configurations, such as a PGA socket, conductor 120 is a pin instead of a pad.

I/O Conductors, Pads, Pins, Bumps, Contacts and Receptacles

As illustrated in FIG. 1, LGA socket 115 includes contacts 118 and conductors 120. As stated above, conductors 120 may couple to power terminals, ground terminals, I/O terminals, clocking terminals or other terminals on microprocessor 126. The use of I/O terminals or conductors often refers to a terminal or conductor to carry an input or output signal, such as an address or data signal. However, in one embodiment, use of I/O conductor refers to data or address signals, as well as ground signals, in a section of a bumpout, pinout, or padout configuration on an integrated circuit. I/O conductors and organization/configurations of sections of an IC are discussed in more detail in reference to FIG. 3.

Figure 2:
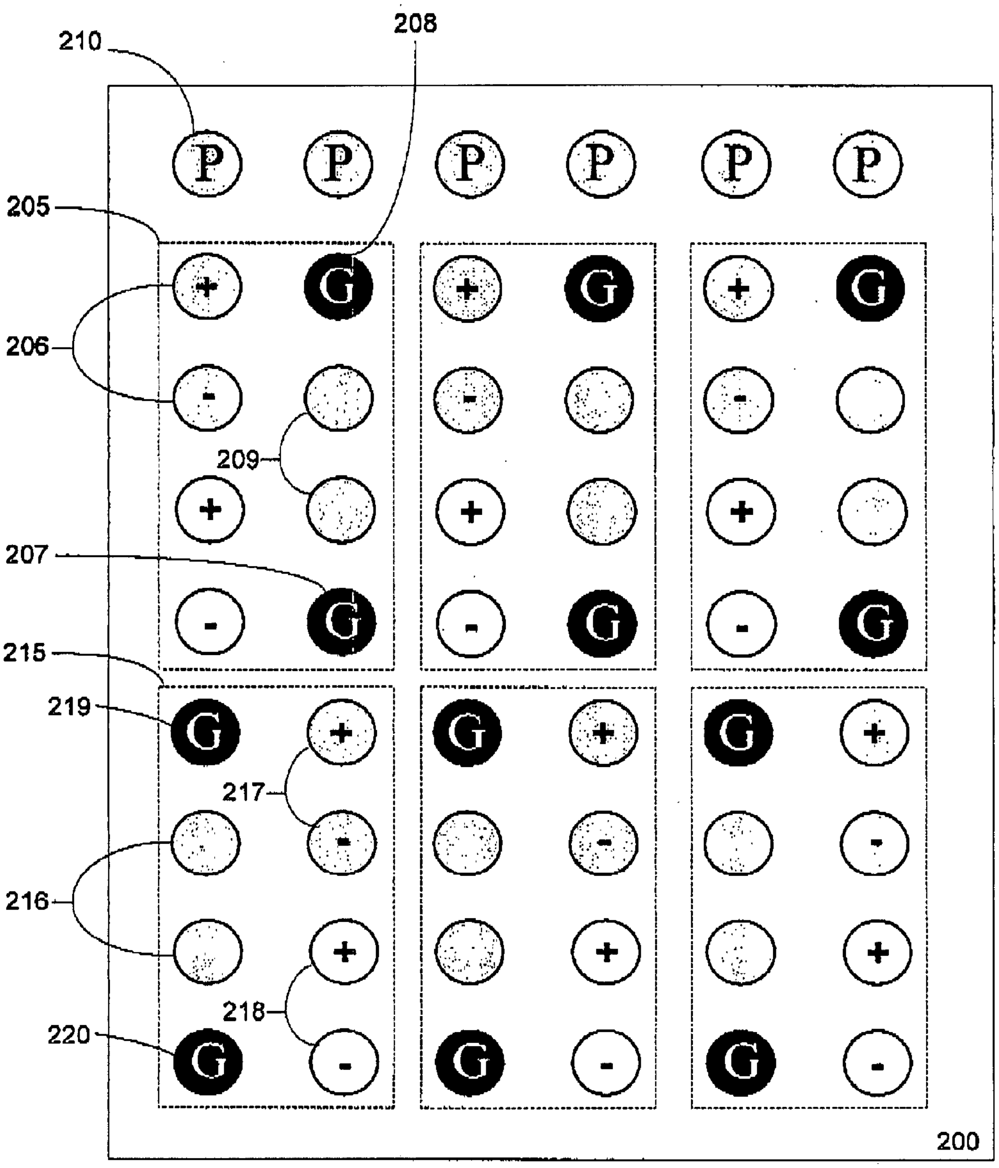
FIG. 2 illustrates an embodiment of a top down view of I/O conductors on an integrated circuit.

Turning to FIG. 2, an illustrative segment of I/O conductors is shown. As stated above, an I/O conductor includes any conductor, such as a pad, pin, bump, ball, contact, or pin on an IC or package for transmitting or receiving a signal. In one embodiment, an I/O conductor includes ground conductors to be coupled to ground and data conductors to carry data signals. However, in another embodiment an I/O conductor is a conductor for carrying a ground signal, a power signal, a data signal, an address signal, a clocking signal, an asynchronous signal, or other associated IC input/output operational signal. In the example shown, 48 of the 54 conductors are organized in a rectangular T-spline. Box 205 depicts a 2×4 rectangular T-spline configuration, also referred to as a 2×4 rectangular-T pattern, of I/O conductors.

In this case, a first line of four conductors on the right include a pair of conductors 209 to carry differential signals, as represented by the + and − symbols, disposed between two ground conductors 207-208. In the second line of four conductors on the left, two pairs of differential conductors are also illustrated. Consequently, the spline configuration, as shown, has: (1) a rectangular shape with a longer length of four conductors than the width of two conductors; and (2) a T shape as viewed between the differential conductors, as the number of differential conductors in one line are fewer in number than the other line creating a T-like shape. Note that the orientation of the lines may be in vertical columns as shown in FIG. 2 or in horizontal rows, where 2×4 rectangular T-spline 205 is rotated ninety degrees into rows.

When repeating 2×4 rectangular T-spline 205, the order of lines may also be inverted. For example, in segment 215 ground conductors 219 and 220, as well as first differential pair 216 are in the left column and second and third differential pairs 217 and 218 are in the right column. Here, the configuration may also be referred to as a 2×8 rectangular double-T pattern, having two ground signals and three differential pairs in each column. However, the combination of box 205 and 215 merely repeats the 2×4 rectangular T-spline configuration with inverted columns, which as discussed above, is included in the usage of the term "repeatable" 2×4 rectangular-T pattern.

Although the configuration/organization of conductors forming a 2×4 rectangular T-spline are discussed in reference to conductors on an IC, the 2×4 rectangular T-spline configuration is not so limited. For example, in an LGA socket, as shown in FIG. 1, the same 2×4 rectangular T-spline configuration is used for contacts, such as contact 118. Similarly, in other socket configurations the receptacles, balls, and/or vias making connection to the PCB correspond with the conductors on the IC.

As an example, assume that an LGA style socket is used, where a package of a microprocessor has a pad configuration as represented in FIG. 2. A socket to engage that IC includes corresponding contacts for each pad. Therefore, assuming FIG. 2 is a top view looking down on the IC, then the LGA socket would have two contacts coupled to differential traces in the PCB to correspond with differential pair 206.

As can be seen from the example, the configuration of conductors both on an IC and in a socket act as a signature. The layout of power, ground, I/O, clocking, and other conductors corresponds to each other to ensure communication between device on the correct terminals. As a result, a microprocessor, a package, and a socket may all have a portion of their conductors organized in a corresponding 2×4 rectangular T-spline. The portion may be an entire section of conductors on an IC, a portion of a section, or a portion of a plurality of section on the IC.

Figure 3A:
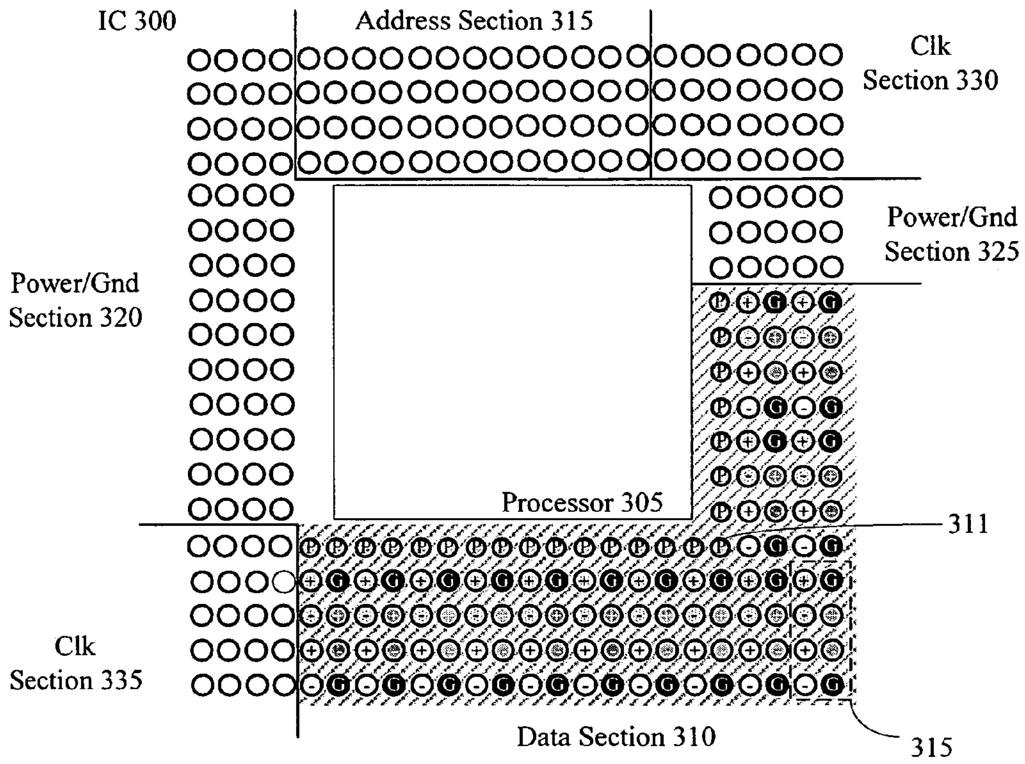
FIG. 3*a* illustrates a top view of an embodiment of an IC with a conductor breakout including a portion organized in a 2×4 rectangular T-pattern.

For example, turning to FIG. 3*a*, data section 310, which is shaded, of IC 300 includes power, ground, and data signal conductors. The ground and data signal conductors are organized in a repeatable 2×4 rectangular T-spline. IC 300 includes microprocessor 305 in a package including conductors, such as pads, configured in data section 310, clock section 330 and 335, address section 315, and power/ground sections 320 and 325. In this example, I/O conductors include the data signals and ground signals configured in the rectangular T-spline in data section 310 discussed in more detail below. However, other sections of the package may also potentially be referred to as I/O conductors, as they receive and transmit signals, such as addressing signals, clocking signals, asynchronous signals, and power signals.

In one embodiment, I/O section 310 logically includes only the ground and differential pair conductors, and not row 311 of power conductors, even though physically the power conductors in row 311 are present. In an alternate embodiment, illustrated by the shading in data section 310, the power conductors are part of I/O data section 310. As a consequence, even an I/O section of an IC may only have a portion of the I/O section configured in a rectangular T-spline fashion. In another example, the 2×4 rectangular T-spline configuration illustrated in box 315 is repeated to form a 2×8 configuration, as shown in FIG. 2, with a ninth row of power conductors.

As can be seen, a portion of the conductors on IC 300 are in a 2×4 rectangular T-spline configuration, while other sections, such as power/ground sections 320 and 325 include similar style pads or conductors to carry power or ground signals that are potentially not organized in a rectangular T-spline. However, other sections, such as address sections 315 and clock sections 330 and 335, may also be configured as a rectangular T-spline or other pinout organizations. As stated above, assuming FIG. 3*a* is illustrating a top down view of a padout configuration for an LGA style package, then a corresponding socket would have the lower right section, i.e. the data section of the socket, organized in the same corresponding manner, to ensure connection to the correct traces and/or signal planes in a PCB.

Figure 3B:
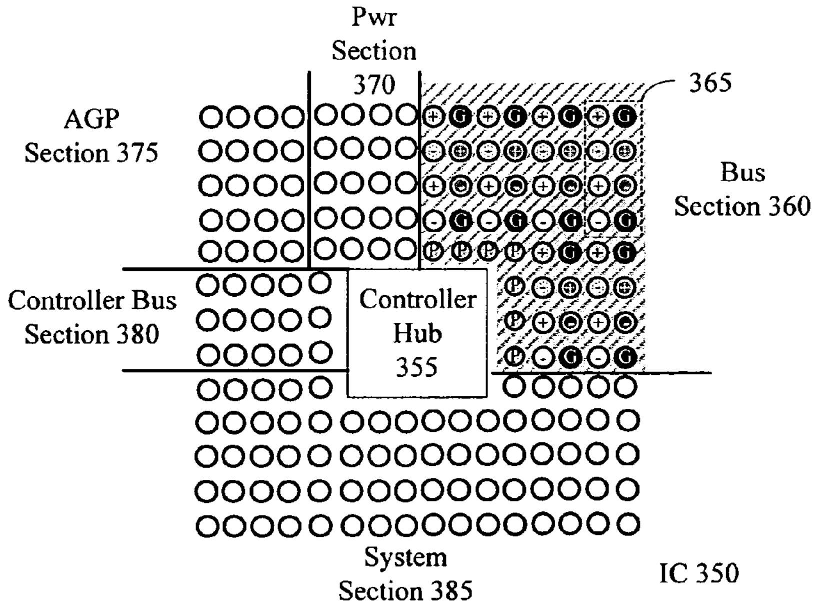
FIG. 3*b* illustrates a top view of another embodiment of an IC with a conductor breakout including a portion organized in a 2×4 rectangular T-pattern.

Referring to FIG. 3*b*, another example of a pinout, padout, bumpout, or IC conductor organization is illustrated. Once again, a pinout or padout configuration on a package is illustrated. Here, IC 350 includes controller hub 355, such as a memory controller hub (MCH) or input/output controller hub (ICH), in a package. In contrast, to the example discussed in reference to FIG. 3*a*, assume that FIG. 3*b* depicts a PGA style package or a BGA style package. In the PGA style package, the conductors illustrated include pins and the socket for coupling IC 350 to a PCB includes receptacles that correspond to each of the pins.

As stated above, a receptacle corresponding to a pin includes having the receptacle coupled to a trace or signal plane in a PCB that corresponds to the pin. For example, assume that a first pin is coupled to a ground terminal on controller hub 355. The receptacle that corresponds in location to the first pin in the socket is electrically coupled to a ground plane in a PCB to provide electrical connection, when engaged with IC 350, from the ground plane, through the receptacle/pin engagement, to the ground terminal of controller hub 355.

In FIG. 3*b*, IC 350 includes bus section 360, power section 370, AGP section 375, controller bus section 380, and system section 385. A portion of IC 350 is configured in a 2×4 rectangular T-spline. In one embodiment, where I/O conductors include the ground and signal conductors in bus section 360, the I/O conductors are organized in a repeatable 2×4 rectangular T-spline, as illustrated by box 365.

In one embodiment, a portion of I/O conductors or conductors on an IC are configured in a 2×4 rectangular-T pattern, as discussed above. As specifically illustrated in the examples above, segments or smaller portions of a section, such as a data signaling section, may be organized in a 2×4 rectangular-T pattern. For example, some processors in the market include 478 pins on an IC including an Intel microprocessor in a package. If a portion of the front-side-bus (FSB) section, to carry data signals, i.e. a data signaling section, is organized in a 2×4 rectangular-T pattern, then around 1/10 of the 478 pins may be organized in a 2×4 rectangular-T pattern. Other sockets and packages have a number of contacts, such as pins, including 775 and 1207. As an illustrative range, a package may include between 200 and 2000 conductors. Similarly, a socket may include a corresponding number of contacts/receptacles. However, note that any number of contacts, conductors, or receptacles may be present.

Therefore, illustrative examples of ranges for a portion of conductors on an IC to be organized in a 2×4 rectangular-T pattern include between: (1) 1/16 to 1/2; (2) 1/50 to 1/5; and 1/10 to 1/3. However, within a section or portion of the IC, such as the FSB portion, the data portion of the FSB section, the data portion of a memory bus section, or other portion of a known I/O section of an IC, the portion of conductors organized in a 2×4 rectangular-T pattern may vary between the range of 10% to 100% of the conductors.

An Embodiment of a Method of Inserting an IC into a Socket

Figure 4:
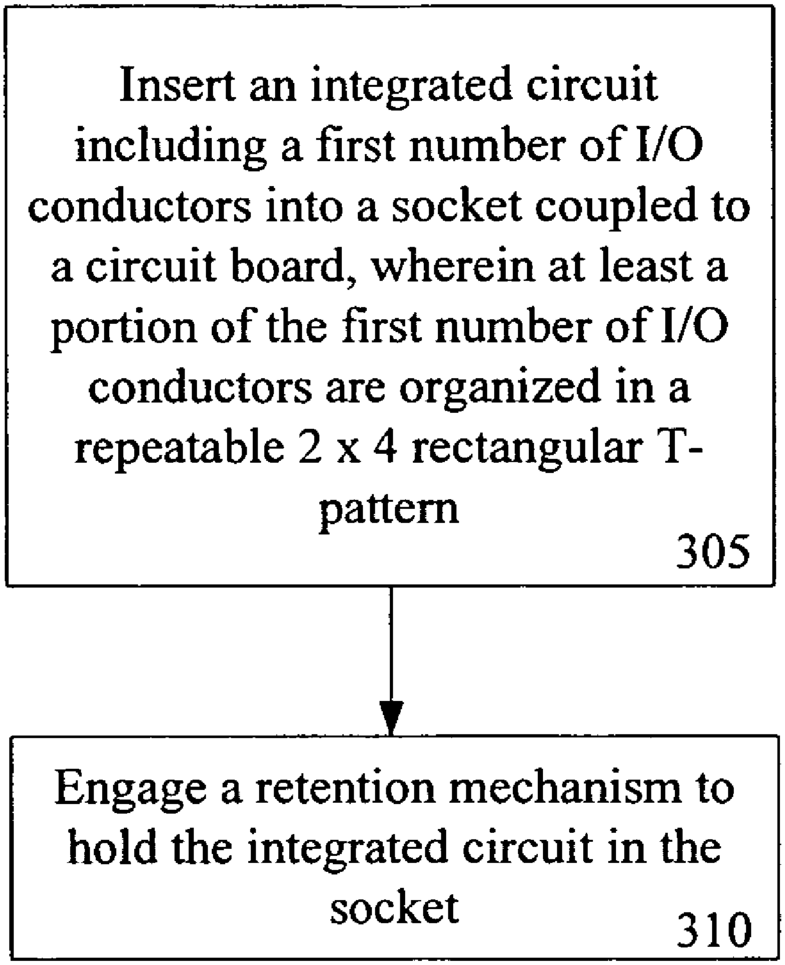
FIG. 4 illustrates an embodiment of a flow diagram from a method of inserting an integrated circuit into a socket.

Turning to FIG. 4, an embodiment of a flow diagram for a method of inserting an IC into a socket is illustrated. In flow 405, an integrated circuit (IC) including a first number of I/O conductors is inserted into a socket coupled to a circuit board, wherein at least a portion of the first number of I/O conductors are organized in a repeatable 2×4 rectangular T-pattern. The circuit board includes any printed circuit board (PCB), such as a motherboard.

In one embodiment, the IC is a microprocessor in a package. Here, the socket is any style of socket, such as an LGA socket where the I/O conductors are lands on the package, a PGA socket where the I/O conductors are pins on the package, or other socket. In another embodiment, the IC is a controller hub or other electronic device to be coupled to a circuit board through a socket, such as an LGA or PGA socket, or directly through soldering, such as in a BGA socket.

As stated above, a portion of the IC may include an I/O section of the IC, such as a front-side bus section, memory bus section, graphics section, I/O device section, common clock section, clocking section, address section, data signal section, or other section of an I/C, as well as a subset or smaller portion of the aforementioned sections.

Next, in flow 310, a retention mechanism is engaged to hold the IC in the socket. A retention mechanism may include any single or combination of the following for clamping/holding an IC in a socket: (1) a lever; (2) a top clamping plate; (3) a bottom clamping plate; and/or (4) tension pins. When a motherboard and IC are oriented as in FIG. 1, with the IC above the socket and the socket on the top of the circuit board, downward force refers a force in a direction from the IC to the PCB. Often a retention mechanism includes a downward force on the IC to clamp it into the socket. The force may include a physical force from a person pushing down on the IC or a mechanical force of a lever locking the IC into the socket. However, other retention mechanisms may use a clamping or crimping force, which may be a sideways force, to make electrical connection.

As can bee seen from the discussion above, conductors on an integrated circuit are potentially laid out in a cost efficient manner without sacrificing signal quality. Previously, to achieve adequate signal quality on an IC, the conductor pattern would have to include a high ratio of ground to signal conductors. For example, a previous layout may require a ground conductor for every two signal carrying conductors. In contrast, in a 2×4 rectangular-T pattern, there are two ground conductors for every six signal carrying conductors. This allows for a conductor, pad, bump, or pin, configuration that allows for more signal carrying conductors and less ground conductors in the same space without adversely affecting signal quality. Consequently, the number of total I/O conductors may be reduced and the package sizes may shrink resulting in cost savings.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:

an integrated circuit including a plurality of Input/Output (I/O) conductors, wherein at least a portion of the plurality of I/O conductors are configured in a repeatable 2×4 rectangular T-spline, and wherein the repeatable 2×4 rectangular T-spline includes two ground I/O conductors and three differential pairs of I/O conductors.

2. The apparatus of claim 1, wherein the two ground I/O conductors and three differential pairs of I/O conductors of the repeatable 2×4 rectangular T-spline are organized into a first set of four I/O conductors in a first line and a second set of four I/O conductors in a second line, the second line being adjacent to the first line.

3. The apparatus of claim 2, wherein the first line is a first column, and wherein the second line is a second column, wherein the first column includes a first of the three differential pairs of I/O conductors disposed between the two ground I/O conductors, and wherein the second column includes a second and a third of the three differential pairs of I/O conductors.

4. The apparatus of claim 2, wherein the first line is a first row, and wherein the second line is a second row.

5. The apparatus of claim 1, wherein the integrated circuit is a microprocessor, and wherein the plurality of I/O conductors are included in a front-side bus section of the microprocessor.

6. The apparatus of claim 1, wherein the integrated circuit includes a microprocessor in a package, and wherein the plurality of I/O conductors are a plurality of I/O pads on the package.

7. The apparatus of claim 1, wherein the integrated circuit is selected from a group consisting of a microprocessor, a packaged microprocessor, a controller hub, a programmable logic array (PLA) device, and an advanced programmable interrupt controller (APIC).

8. The apparatus of claim 1, wherein the plurality of I/O conductors are selected from a group consisting of pads, balls, bumps, contacts, and pins.

9. An apparatus comprising:

a socket coupled to a printed circuit board (PCB), the socket including a plurality of 2×4 rectangular-T pattern of contacts, wherein two of the eight contacts in each of the 2×4 rectangular-T patterns of contacts are electrically coupled to a ground plane in the PCB, and wherein six of the eight contacts in each of the 2×4 rectangular-T patterns of contacts are electrically coupled to signal planes of the plurality of planes in the PCB.

10. The apparatus of claim 9, wherein the socket is a socket selected from a group consisting of a land-grid array (LGA) socket, wherein the contacts include contacts electrically coupled to the PCB, a pin grid array (PGA) socket wherein the contacts include receptacles for pins, and a ball grid array (BGA) socket wherein the contacts include balls.

11. The apparatus of claim 9, wherein the socket includes a total number of contacts between 300 to 1600 receptacles, and wherein 1/16 to 1/2 of the total number of contacts are configured as the plurality of 2×4 rectangular T-spline patterns.

12. A system comprising:

an integrated circuit (IC) including a plurality of conductors, wherein a first portion of the plurality of conductors are organized into a plurality of repeated groups, each of the plurality of repeated groups including a first line of conductors disposed adjacent to a second line of conductors, the first and second lines of conductors including at least four conductors, wherein the first line of conductors includes more conductors to carry signals than the second line of conductors; and a socket including a plurality of corresponding contacts electrically coupled to a printed circuit board (PCB), wherein each of the plurality of corresponding contacts corresponds to one of the plurality of conductors.

13. The system of claim 12, wherein a second portion of the plurality of conductors are power terminals.

14. The system of claim 12, wherein the integrated circuit is a microprocessor in a package, the plurality of conductors are pins coupled to the package, which are electrically coupled to terminals of the microprocessor, and the plurality of corresponding contacts include receptacles for the pins coupled to the PCB.

15. The system of claim 12, wherein the integrated circuit includes a microprocessor coupled to a package, the plurality of conductors include pads on the package, and the plurality of corresponding contacts are land-grid array (LGA) contacts electrically coupled to the PCB.

16. A method comprising:

inserting an integrated circuit including a first number of I/O conductors into a socket coupled to a circuit board, wherein at least a portion of the first number of I/O conductors are organized in a repeatable 2×4 rectangular T-spline, wherein the repeatable 2×4 rectangular T-spline includes two I/O conductors to be coupled to ground and six I/O conductors to be coupled to I/O signaling terminals of the integrated circuit; and engaging a retention mechanism to hold the integrated circuit in the socket.

17. The method of claim 16, wherein the at least a portion of the first number of I/O conductors being organized in a repeatable 2×4 rectangular T-spline includes at least 2/3 of a data signaling section of the first number of I/O conductors being organized in the repeatable 2×4 rectangular T-spline.

18. The method of claim 16, wherein the retention mechanism is selected from a compression mechanism to clamp the integrated circuit into the socket, a lever to lock the integrated circuit in the socket, a set of retention pins to hold the integrated circuit in the socket.

* * * * *